(12) United States Patent
Kitazume

(10) Patent No.: US 12,446,152 B2
(45) Date of Patent: Oct. 14, 2025

(54) ELECTRONIC COMPONENT

(71) Applicant: Murata Manufacturing Co., Ltd., Kyoto-fu (JP)

(72) Inventor: Takahiro Kitazume, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 220 days.

(21) Appl. No.: 18/479,406

(22) Filed: Oct. 2, 2023

(65) Prior Publication Data

US 2024/0032193 A1    Jan. 25, 2024

Related U.S. Application Data

(63) Continuation of application No. PCT/JP2022/005894, filed on Feb. 15, 2022.

(30) Foreign Application Priority Data

Apr. 6, 2021   (JP) .................. 2021-064914

(51) Int. Cl.
| | |
|---|---|
| H05K 1/09 | (2006.01) |
| H01L 23/498 | (2006.01) |
| H05K 1/11 | (2006.01) |
| H05K 1/18 | (2006.01) |

(52) U.S. Cl.
CPC ........ *H05K 1/111* (2013.01); *H01L 23/49838* (2013.01); *H05K 1/09* (2013.01); *H05K 1/181* (2013.01); *H05K 2201/0347* (2013.01); *H05K 2201/09381* (2013.01);

(Continued)

(58) Field of Classification Search
CPC .......... H05K 1/09; H05K 2201/09381; H05K 2201/094; H05K 2201/099
See application file for complete search history.

(56) References Cited

U.S. PATENT DOCUMENTS 9,918,378 B1 *   3/2018  Shimodaira ............ H05K 3/243
2013/0221523 A1   8/2013  Honda et al.

FOREIGN PATENT DOCUMENTS

| JP | 2010-098098 A | 4/2010 |
|---|---|---|
| JP | 2012-104807 A | 5/2012 |
| JP | 5370599 B2 | 12/2013 |

(Continued)

OTHER PUBLICATIONS

International Search Report for PCT/JP2022/005894 dated May 10, 2022.

*Primary Examiner* — Sherman Ng
(74) *Attorney, Agent, or Firm* — McDonald Hopkins LLC

(57) ABSTRACT

An electronic component includes a main body including a first surface, a first electrode and a second electrode arranged on the first surface, and a resist film arranged to isolate the first electrode from the second electrode. The first electrode and the second electrode are mainly composed of a first material. The first electrode includes a first portion including a central portion and having a first thickness and a second portion having a second thickness smaller than the first thickness in at least a part of a peripheral portion. The first portion is covered with a plated film where a film made of a second material higher in affinity for solder than the first material is exposed at an outermost surface. At least a part of the second portion is covered with the resist film. The first portion is distant from the resist film.

7 Claims, 10 Drawing Sheets

(52) U.S. Cl.
CPC ................. *H05K 2201/094* (2013.01); *H05K 2201/09445* (2013.01); *H05K 2201/099* (2013.01)

(56) References Cited

FOREIGN PATENT DOCUMENTS

| | | | |
|---|---|---|---|
| JP | 5407269 | B2 | 2/2014 |
| JP | 2019-087693 | A | 6/2019 |

\* cited by examiner

ELECTRONIC COMPONENT

CROSS REFERENCE TO RELATED APPLICATION

This is a continuation of International Application No. PCT/JP2022/005894 filed on Feb. 15, 2022 which claims priority from Japanese Patent Application No. 2021-064914 filed on Apr. 6, 2021. The contents of these applications are incorporated herein by reference in their entireties.

BACKGROUND OF THE DISCLOSURE

Field of the Disclosure

The present disclosure relates to an electronic component.

Description of the Related Art

An electronic component where a plurality of electrodes are arranged on one surface of a substrate, the electronic component being mounted on another substrate or the like with the use of these electrodes, has been known. In such a case, prevention of short-circuiting between adjacent electrodes is required.

A solder mask defined (SMD) structure in which a resist film is arranged to cover a peripheral portion of an electrode arranged on a surface of a substrate has been known. Though the SMD structure is low in ability to prevent short-circuiting between adjacent electrodes, the peripheral portion of the electrode is covered and hidden, and hence adhesion strength between the electrode and the substrate can be enhanced. On the other hand, a non-solder mask defined (NSMD) structure in which a resist film is arranged at a distance from an electrode arranged on a surface of a substrate has also been known. Though the NSMD structure is high in ability to prevent short-circuiting between adjacent electrodes because of its ability to accommodate overflow solder in a gap, adhesion strength between the electrode and the substrate remains low.

For example, Japanese Patent No. 5407269 (PTL 1) describes a structure in which a semiconductor element is flip-chip mounted on one main surface of a circuit board. In this structure, a plurality of electrode terminals are arranged on an upper surface of the circuit board and a portion of the surface of the circuit board other than the electrode terminals is covered with a solder resist layer. Since a peripheral portion of the electrode terminal is covered with the solder resist layer, it can be concluded that the SMD structure is adopted for these electrode terminals. In PTL 1, a plurality of electrodes arranged on a lower surface of the semiconductor element are connected to the plurality of electrode terminals on the circuit board by hollow electrodes and conductive members. The hollow electrode includes a recess and the conductive member is arranged as being accommodated in the recess. According to the description of a manufacturing method in PTL 1, the hollow electrodes or the hollow electrodes and the conductive members are provided on the electrode terminals on the circuit board in advance and the semiconductor element is mounted thereon.

PTL 1 also describes an example to the contrary in which while the hollow electrodes are provided in advance on the electrodes of the semiconductor element, the semiconductor element is mounted on the circuit board.

PTL 1: Japanese Patent No. 5407269

BRIEF SUMMARY OF THE DISCLOSURE

In PTL 1, in order to form the hollow electrode on the electrode terminal of the circuit board or on the electrode of the semiconductor element, a large number of steps should be performed. In addition, the hollow electrode is interposed between the electrode terminal of the circuit board and the electrode of the semiconductor element, which is disadvantageous for reduction in profile.

A possible benefit of the present disclosure is to provide an electronic component that is not disadvantageous for reduction in profile while it achieves ensured adhesiveness of an electrode and suppression of short-circuiting between adjacent electrodes.

In order to achieve the possible benefit, an electronic component based on the present disclosure includes a main body including a first surface, a first electrode and a second electrode arranged on the first surface, and a resist film arranged to isolate the first electrode from the second electrode. The first electrode and the second electrode are mainly composed of a first material. The first electrode includes a first portion including a central portion and having a first thickness and a second portion having a second thickness smaller than the first thickness in at least a part of a peripheral portion. The first portion is covered with a plated film where a film made of a second material higher in affinity for solder than the first material is exposed at an outermost surface. At least a part of the second portion is covered with the resist film. The first portion is distant from the resist film.

According to the present disclosure, an electronic component that is not disadvantageous for reduction in profile while it achieves ensured adhesiveness of an electrode and suppression of short-circuiting between adjacent electrodes can be realized.

DETAILED DESCRIPTION OF THE DISCLOSURE

Figure 1:
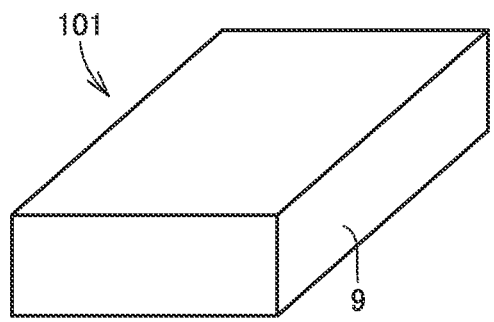
FIG. 1 is a perspective view of an electronic component in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

Figure 2:
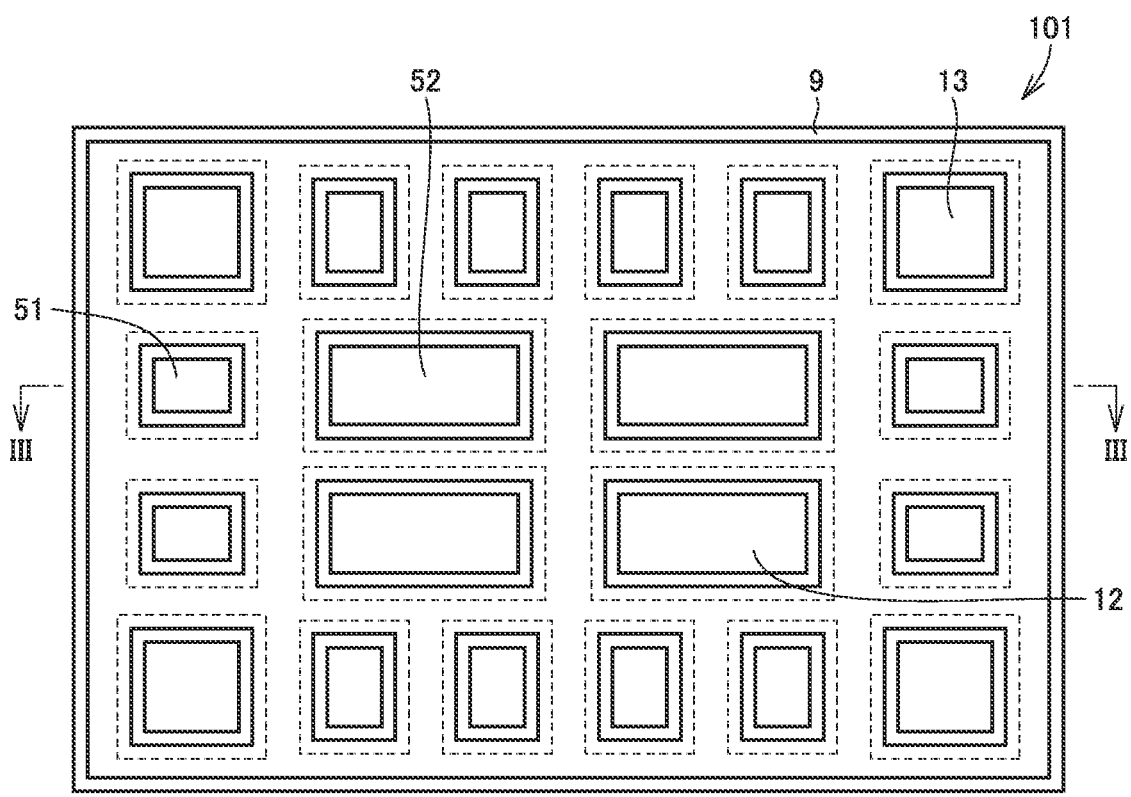
FIG. 2 is a bottom view of the electronic component in the first embodiment based on the present disclosure.

An electronic component in a first embodiment based on the present disclosure will be described with reference to FIGS. 1 to 4. FIG. 1 shows a perspective view of an electronic component 101 in the present embodiment. Electronic component 101 is in a shape of a parallelepiped. Electronic component 101 has an upper surface and side surfaces covered with a shield film 9. FIG. 2 shows a bottom view of electronic component 101. As shown in FIG. 2, electronic component 101 includes a GND terminal 12 and an IO terminal 13 on a lower surface. A plurality of GND terminals 12 are arranged in a central portion of the lower surface. In an example shown here, four GND terminals 12 are arranged in the central portion. A plurality of IO terminals 13 are arranged to surround the GND terminals. In the example shown here, sixteen IO terminals 13 are arranged.

Two terminals arbitrarily selected from a group of the plurality of GND terminals 12 and the plurality of IO terminals 13 as a whole are defined as a first electrode 51 and a second electrode 52. In the example shown here, one of IO terminals 13 is defined as first electrode 51 and one of GND terminals 12 is defined as second electrode 52.

Figure 3:
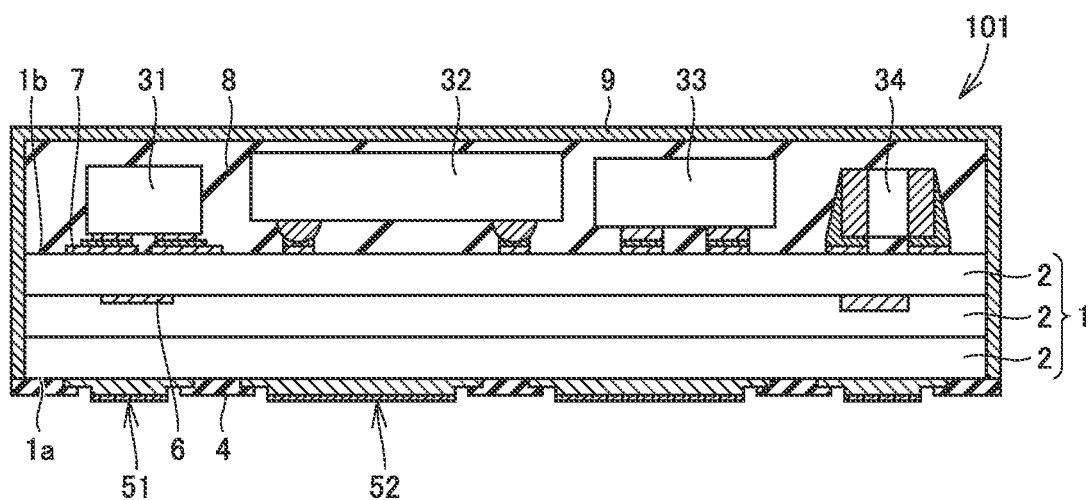
FIG. 3 is a cross-sectional view along the line III-III in FIG. 2.
Figure 4:
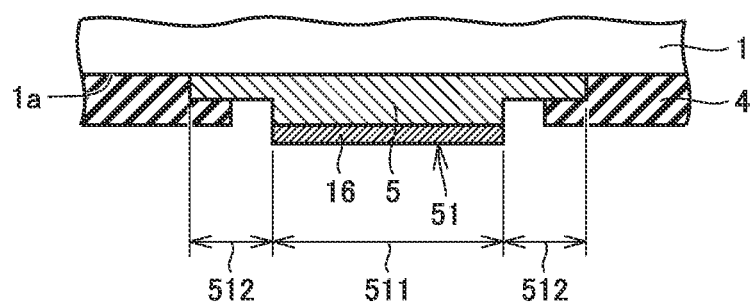
FIG. 4 is an enlarged view of a part of FIG. 3.

FIG. 3 shows a cross-sectional view along the line III-III in FIG. 2. In the example shown here, substrate 1 is formed by layering and integrating a plurality of insulating layers 2, however, it is merely by way of example. Substrate 1 may be in another structure. Substrate 1 shown here includes a first surface 1a and a second surface 1b. An internal electrode 6 is arranged in the inside of substrate 1. A surface electrode 7 is arranged on second surface 1b of substrate 1. Components 31, 32, 33, and 34 are mounted on second surface 1b of substrate 1, with surface electrode 7 being interposed. A sealing resin 8 is arranged to cover second surface 1b and components 31, 32, 33, and 34. A shield film 9 is arranged to cover the side surfaces of substrate 1 and side surfaces and an upper surface of the sealing resin. FIG. 4 shows a part of FIG. 3 as being enlarged.

Electronic component 101 includes substrate 1 as a main body including first surface 1a, first electrode 51 and second electrode 52 arranged on first surface 1a, and a resist film 4 arranged to isolate first electrode 51 from second electrode 52. First electrode 51 and second electrode 52 are mainly composed of a first material, and first electrode 51 includes a first portion 511 including a central portion and having a first thickness and a second portion 512 having a second thickness smaller than the first thickness in at least a part of a peripheral portion. First portion 511 is covered with a plated film 16 in which a film made of a second material higher in affinity for solder than the first material is exposed at an outermost surface. At least a part of second portion 512 is covered with resist film 4. First portion 511 is distant from resist film 4.

For example, Cu may be employed as the first material. A portion of first electrode 51 and second electrode 52 other than plated film 16 may be formed, for example, of Cu. A copper foil may be worked to form first electrode 51 and second electrode 52.

For example, Au is employed as the second material. Plated film 16 may be made, for example, by Ni/Au plating. "Ni/Au plating" means plating initially with Ni and further plating with Au to cover a surface of Ni plating.

In electronic component 101 in the present embodiment, first portion 511 of first electrode 51 projects and first portion 511 is covered with plated film 16, which enhances affinity for solder and facilitates soldering. In at least a part of the peripheral portion, second portion 512 is provided, and at least a part of second portion 512 is covered with resist film 4. Therefore, adhesiveness of first electrode 51 to the main body can be enhanced. Since first portion 511 is distant from resist film 4, a space where overflow solder is introduced is provided between first portion 511 and resist film 4. Therefore, even when the surface of first electrode 51 overflows with solder, solder is less likely to reach an adjacent electrode. Therefore, short-circuiting between adjacent electrodes can be suppressed. Though first electrode 51 includes first portion 511 and second portion 512 in a single electrode, this structure is not disadvantageous for reduction in profile.

Therefore, according to the present embodiment, an electronic component that is not disadvantageous for reduction in profile while it achieves ensured adhesiveness of an electrode and suppression of short-circuiting between adjacent electrodes can be provided.

As shown in the present embodiment, preferably, a height difference is provided between first portion 511 and second portion 512. Adoption of such a construction clarifies distinction between the first portion and the second portion, and use of first portion 511 for soldering can be facilitated.

As shown in the present embodiment, preferably, Cu is employed as the first material. Adoption of such a feature provides first electrode 51 and second electrode 52 excellent in conductivity.

As shown in the present embodiment, preferably, Au is employed as the second material. Adoption of such a feature allows high affinity between the surface of first electrode 51 and solder and facilitates soldering.

As shown in the present embodiment, preferably, plated film 16 includes a two-layered structure composed of a Ni plated film and an Au plated film. Adoption of such a construction leads to exposure of Au at the outermost surface for ensured affinity for solder and interposition of the Ni plated film between Au and the first material for prevention of a defect due to diffusion between Au and the first material.

Figure 5:
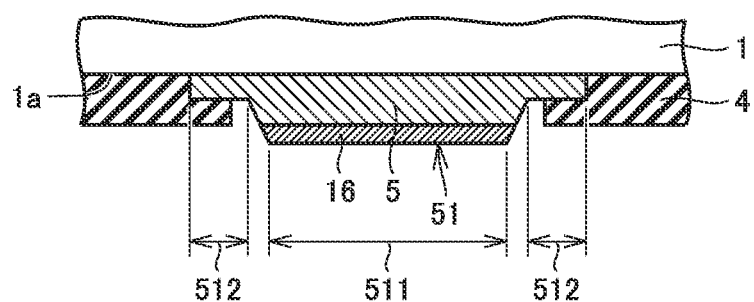
FIG. 5 is a partially enlarged cross-sectional view of a first modification of the electronic component in the first embodiment based on the present disclosure.
Figure 6:
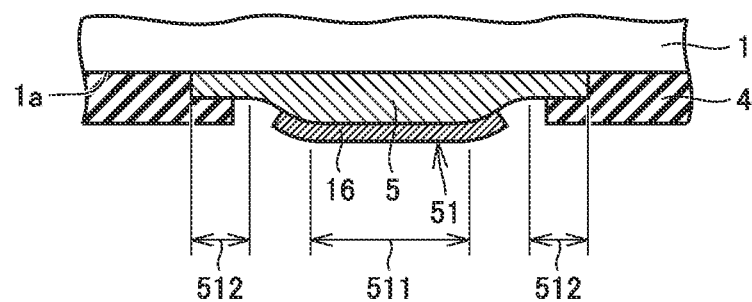
FIG. 6 is a partially enlarged cross-sectional view of a second modification of the electronic component in the first embodiment based on the present disclosure.

In the example shown in FIG. 4, first portion 511 and second portion 512 are contiguous to each other and a height difference defined by a perpendicular wall is provided at a boundary between a large thickness portion and a small thickness portion of first electrode 51. This, however, is merely by way of example and limitation as such is not intended. For example, as shown in FIG. 5, there may be a slope between first portion 511 and second portion 512. First portion 511 and second portion 512 do not necessarily have to be contiguous to each other. As shown in FIG. 6, the thickness of first electrode 51 may gradually vary.

(Manufacturing Method)

A manufacturing method for obtaining electronic component 101 shown in the first embodiment will be described. With attention being paid to first electrode 51 as a representative electrode in the group of the plurality of GND terminals 12 and the plurality of IO terminals 13 as a whole, how to realize the structure thereof will be described.

Figure 7:
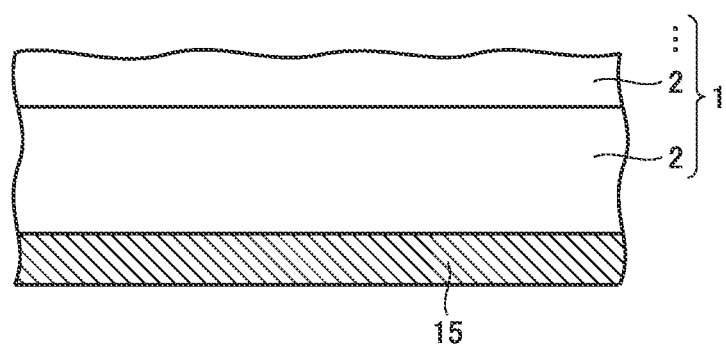
FIG. 7 is an illustrative view of a first step of a method of manufacturing an electronic component in the first embodiment based on the present disclosure.

Initially, as shown in FIG. 7, a structure in which one surface of substrate 1 is covered with a conductor film 15 is prepared. Substrate 1 is formed by layering a plurality of insulating layers 2. A metallic film may be employed as conductor film 15. For example, a copper foil may be employed as conductor film 15.

Figure 8:
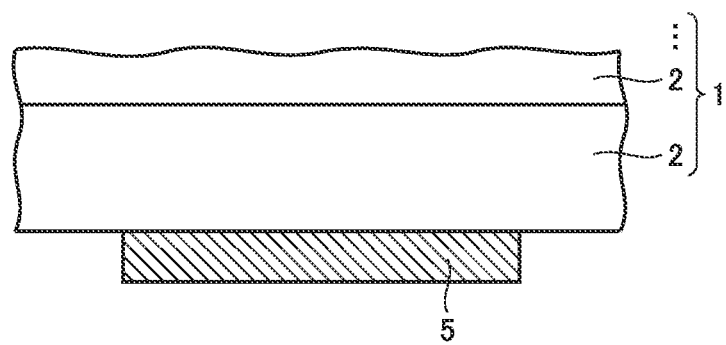
FIG. 8 is an illustrative view of a second step of the method of manufacturing an electronic component in the first embodiment based on the present disclosure.
Figure 9:
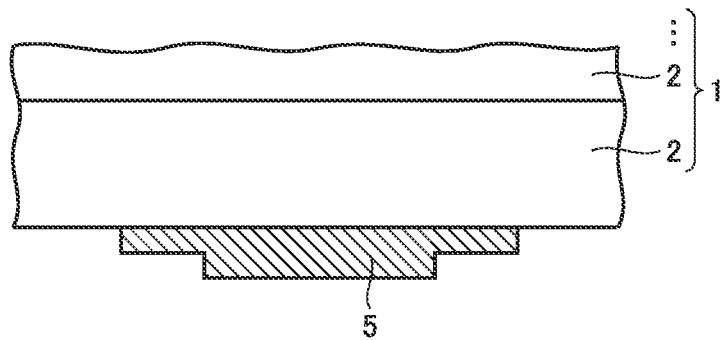
FIG. 9 is an illustrative view of a third step of the method of manufacturing an electronic component in the first embodiment based on the present disclosure.

As shown in FIG. 8, a conductor pattern 5 is obtained by patterning conductor film 15. Furthermore, a central portion of conductor pattern 5 is masked to expose a peripheral portion. The exposed portion is etched to a depth intermediate in a direction of thickness, to thereby obtain a structure shown in FIG. 9. The central portion of conductor pattern 5 is large in thickness and the peripheral portion is small in thickness.

Figure 10:
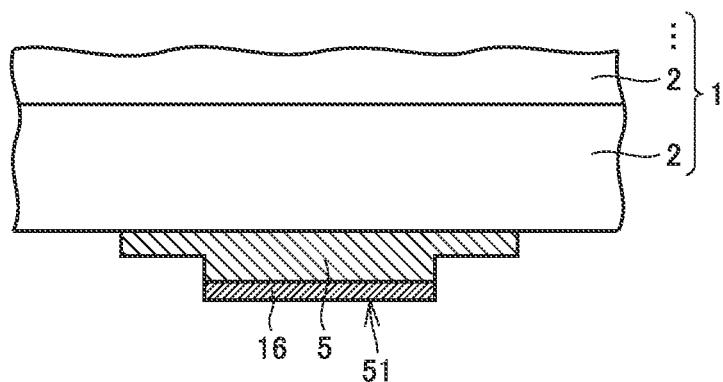
FIG. 10 is an illustrative view of a fourth step of the method of manufacturing an electronic component in the first embodiment based on the present disclosure.
Figure 11:
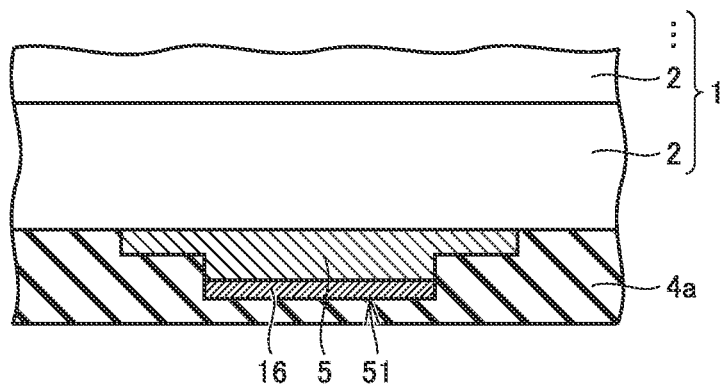
FIG. 11 is an illustrative view of a fifth step of the method of manufacturing an electronic component in the first embodiment based on the present disclosure.

Furthermore, as shown in FIG. 10, plated film 16 is formed in the central portion of conductor pattern 5. As shown in FIG. 11, solder resist is applied to the entire surface and semi-cured. A semi-cured resist film 4a is thus formed.

Figure 12:
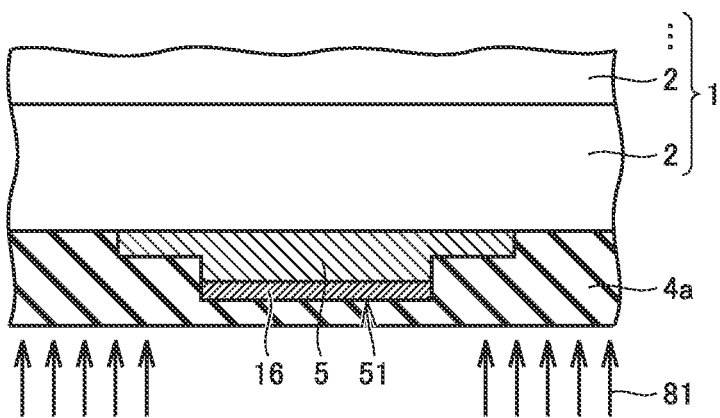
FIG. 12 is an illustrative view of a sixth step of the method of manufacturing an electronic component in the first embodiment based on the present disclosure.
Figure 13:
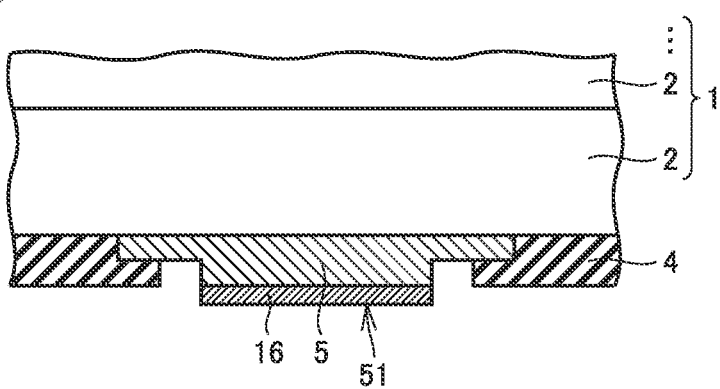
FIG. 13 is an illustrative view of a seventh step of the method of manufacturing an electronic component in the first embodiment based on the present disclosure.

In an exposure step, as shown in FIG. 12, a partial area is irradiated with light 81. In a portion of resist film 4a irradiated with light 81, the solder resist is cured. Thereafter, a development step and a post-curing step are performed. A structure shown in FIG. 13 is thus obtained. A portion of resist film 4a where the solder resist has been cured to remain serves as resist film 4. The structure shown in FIG. 4 is thus obtained. Though description is given with attention being paid to first electrode 51, another electrode can also similarly be formed through these steps.

Second Embodiment

Figure 14:
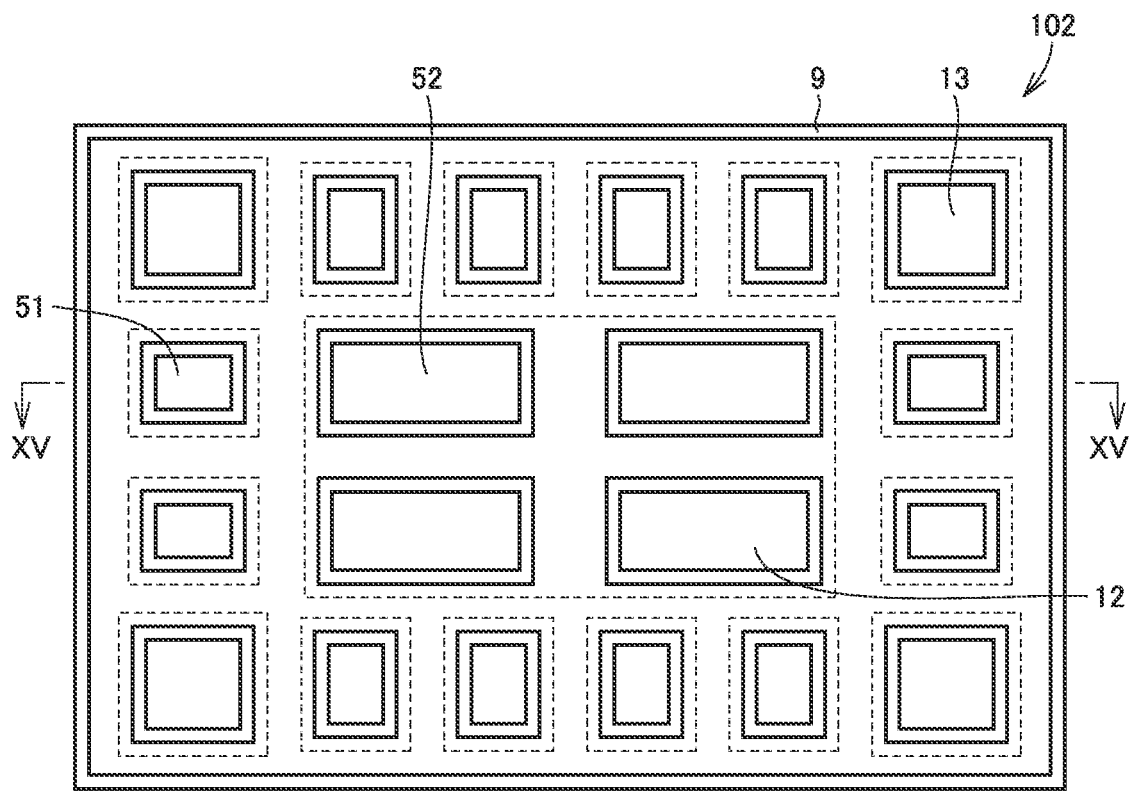
FIG. 14 is a bottom view of an electronic component in a second embodiment based on the present disclosure.
Figure 15:
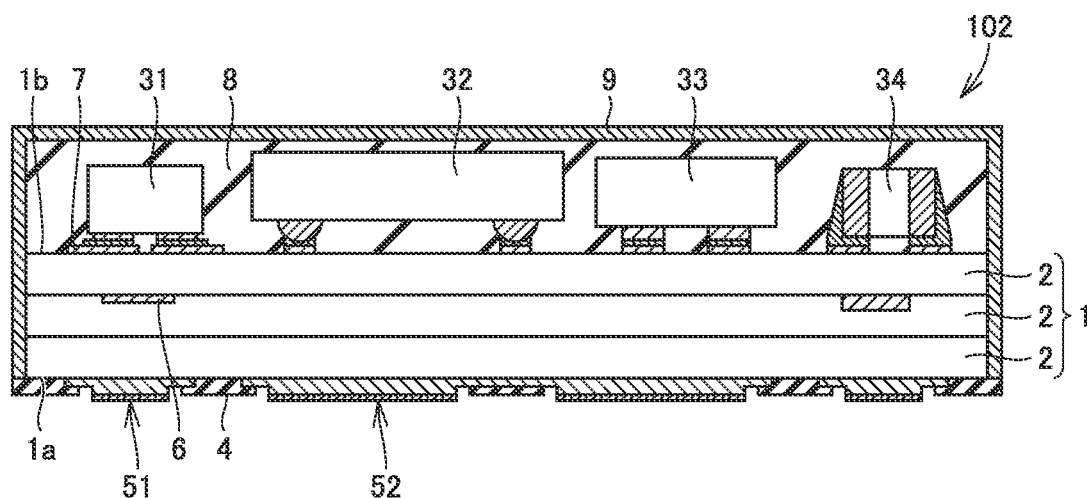
FIG. 15 is a cross-sectional view along the line XV-XV in FIG. 14.

An electronic component in a second embodiment based on the present disclosure will be described with reference to FIGS. 14 to 15. FIG. 14 shows a bottom view of an electronic component 102 in the present embodiment. FIG. 15 shows a cross-sectional view along the line XV-XV in FIG. 14. In electronic component 102, four GND terminals 12 are arranged in the central portion of the lower surface. These four GND terminals 12 are connected to one another in the inside and integrated. In the present embodiment, one of IO terminals 13 is defined as first electrode 51 and the entirety of four GND terminals 12 connected to one another in an integrated manner is defined as second electrode 52. Second electrode 52 is partially covered and hidden by resist film 4 to thereby provide four exposed portions, each of which serves as GND terminal 12.

The electronic component is otherwise similar in construction to electronic component 101 shown in the first embodiment.

The present embodiment can also obtain an effect similar to that described in the first embodiment.

Third Embodiment

Figure 16:
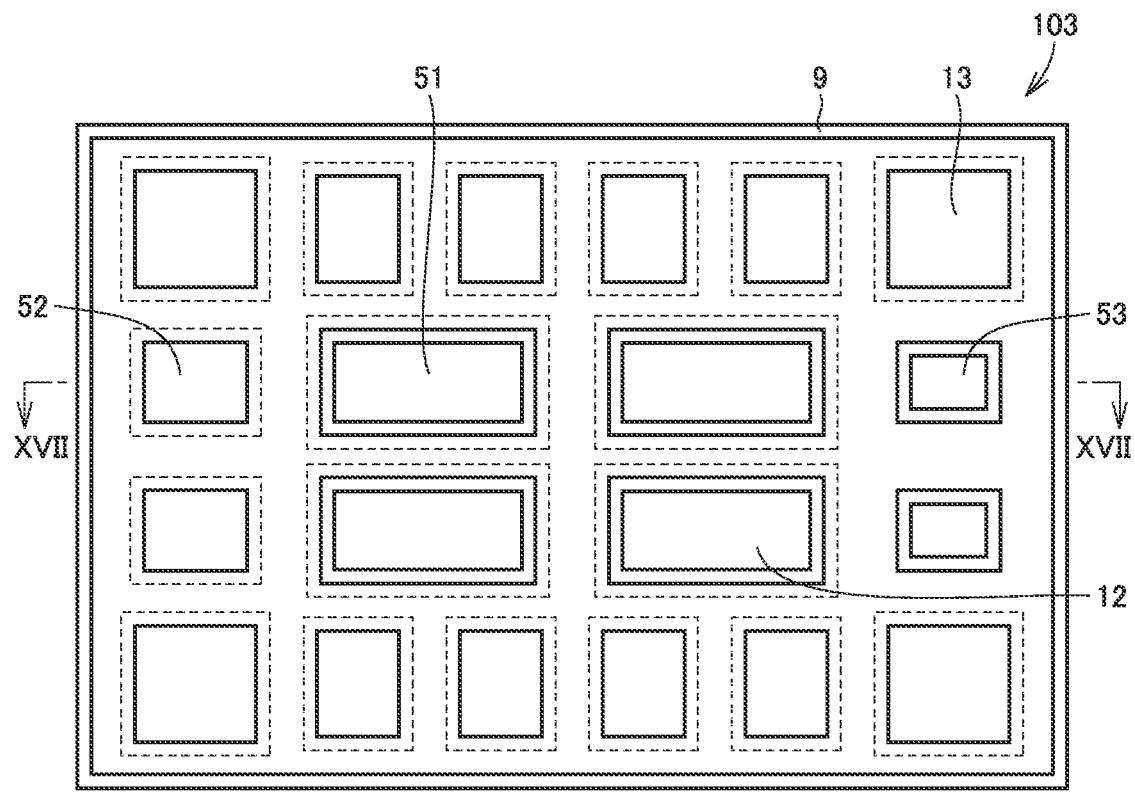
FIG. 16 is a bottom view of an electronic component in a third embodiment based on the present disclosure.
Figure 17:
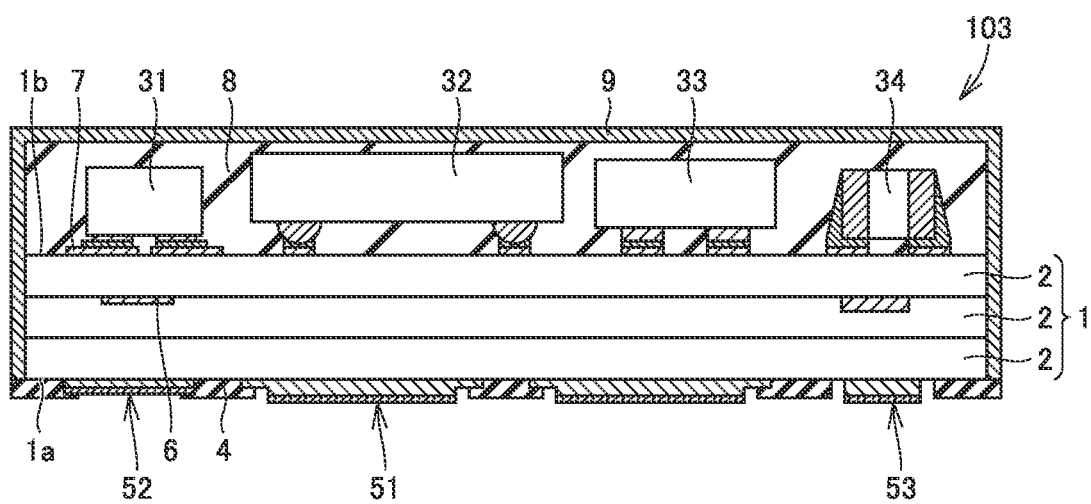
FIG. 17 is a cross-sectional view along the line XVII-XVII in FIG. 16.

An electronic component in a third embodiment based on the present disclosure will be described with reference to FIGS. 16 to 17. FIG. 16 shows a bottom view of an electronic component 103 in the present embodiment. FIG. 17 shows a cross-sectional view along the line XVII-XVII in FIG. 16. In electronic component 103, four GND terminals 12 located in the central portion of the lower surface are the same in structure as four GND terminals 12 shown in the first embodiment, whereas the structure of IO terminals 13 arranged to surround the GND terminals is different from that in the first embodiment. Fourteen of sixteen IO terminals 13 are in the SMD structure and two of them are in the NSMD structure. One of four GND terminals 12 is defined as first electrode 51. One of IO terminals 13 is defined as second electrode 52. Furthermore, another one of IO terminals 13 is defined as a third electrode 53. Second electrode 52 is in the SMD structure. In other words, resist film 4 covers an outer edge portion of second electrode 52. Third electrode 53 is in the NSMD structure.

The electronic component is otherwise similar in construction to electronic component 101 shown in the first embodiment.

The present embodiment can also obtain an effect similar to that described in the first embodiment.

Fourth Embodiment

Figure 18:
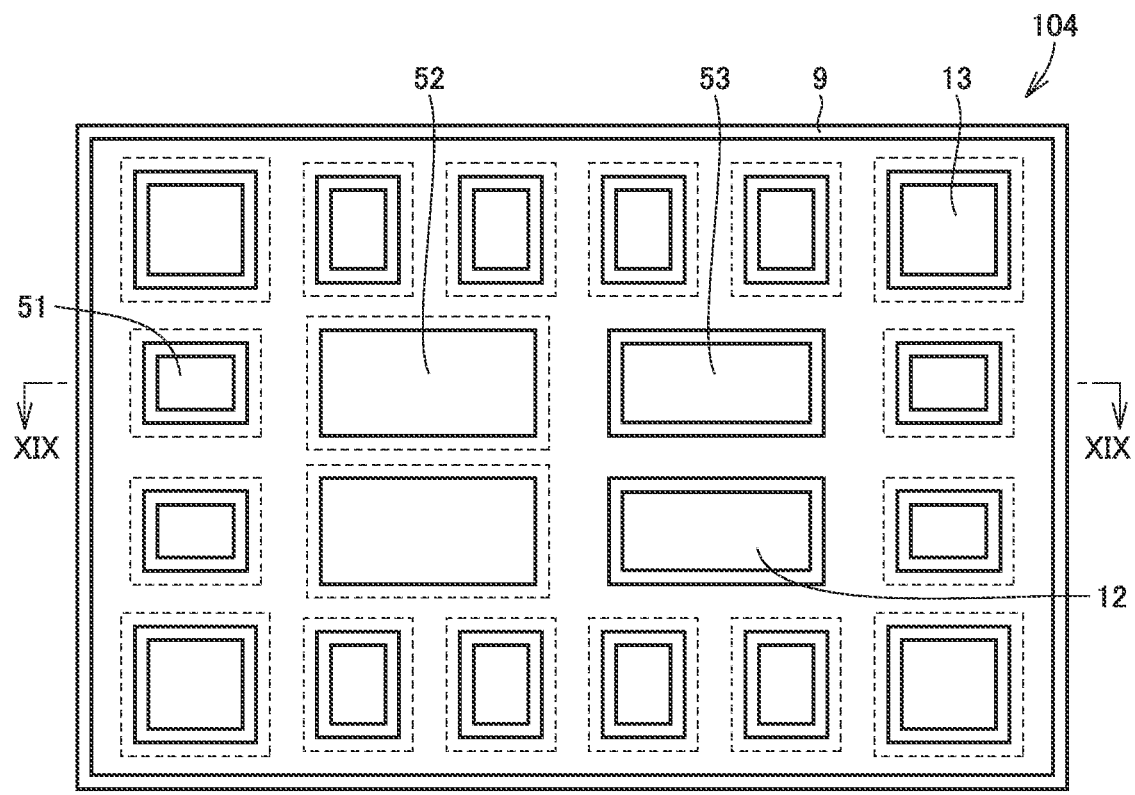
FIG. 18 is a bottom view of an electronic component in a fourth embodiment based on the present disclosure.
Figure 19:
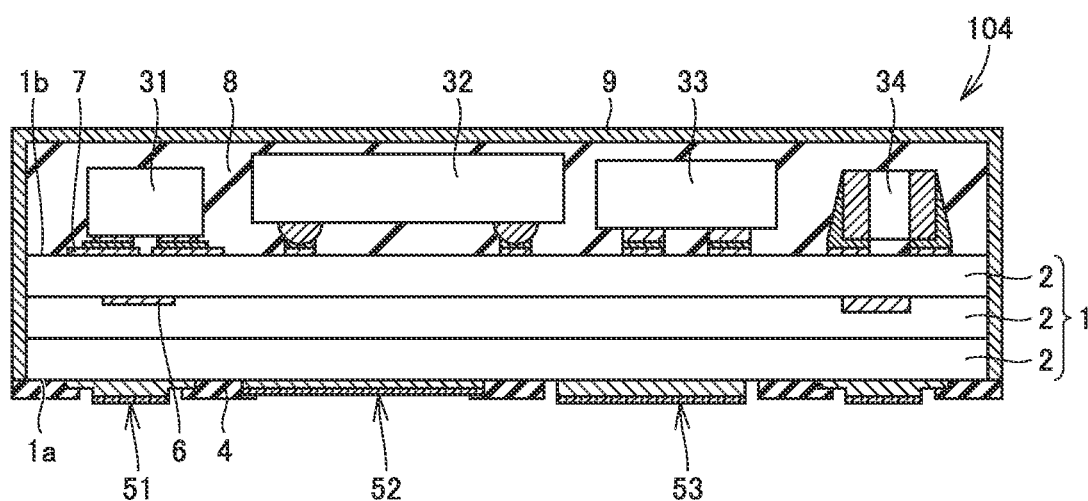
FIG. 19 is a cross-sectional view along the line XIX-XIX in FIG. 18.

An electronic component in a fourth embodiment based on the present disclosure will be described with reference to FIGS. 18 to 19. FIG. 18 shows a bottom view of an electronic component 104 in the present embodiment. FIG. 19 shows a cross-sectional view along the line XIX-XIX in FIG. 18. In electronic component 104, two GND terminals on the left in FIG. 18 of four GND terminals 12 located in the central portion of the lower surface are in the SMD structure, and two GND terminals on the right are in the NSMD structure. The structure of IO terminals 13 arranged to surround these four GND terminals 12 is the same as in the first embodiment. One of IO terminals 13 is defined as first electrode 51. One of four GND terminals 12 located in the central portion is defined as second electrode 52.

The electronic component is otherwise similar in construction to electronic component 101 shown in the first embodiment.

The present embodiment can also obtain an effect similar to that described in the first embodiment.

Fifth Embodiment

Figure 20:
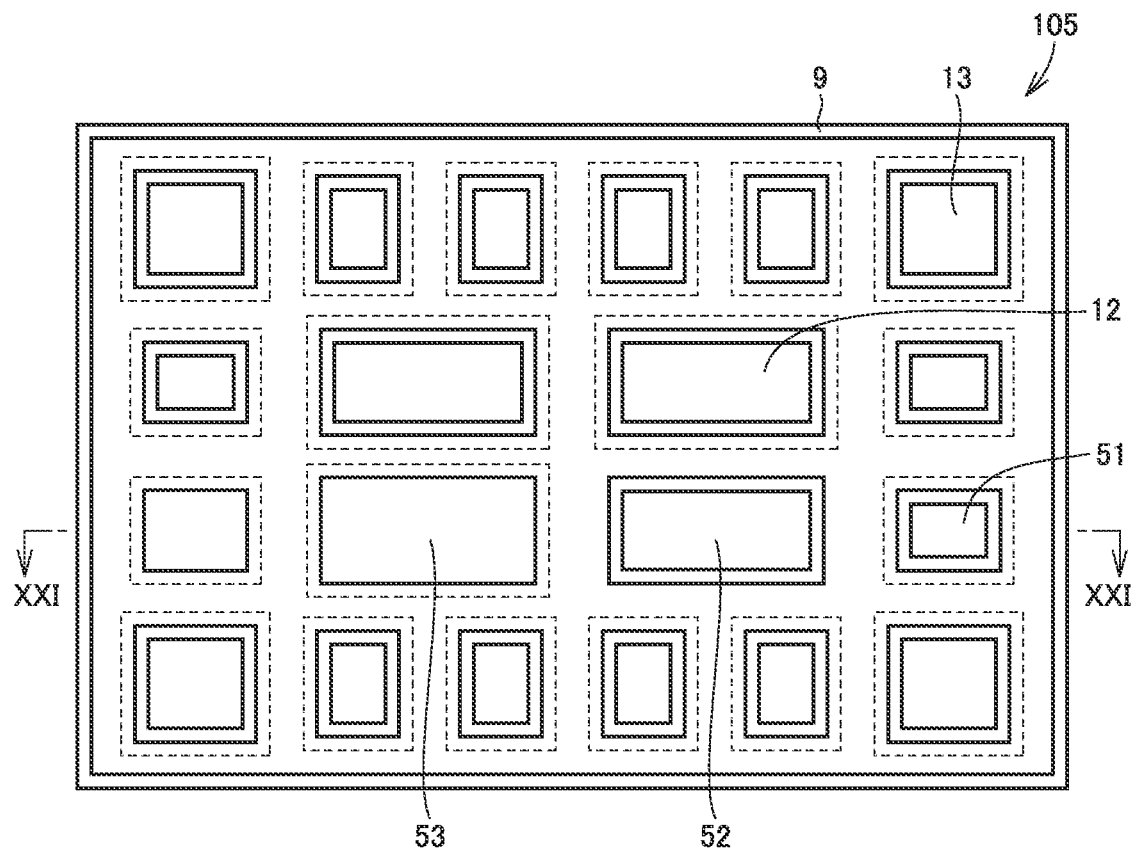
FIG. 20 is a bottom view of an electronic component in a fifth embodiment based on the present disclosure.
Figure 21:
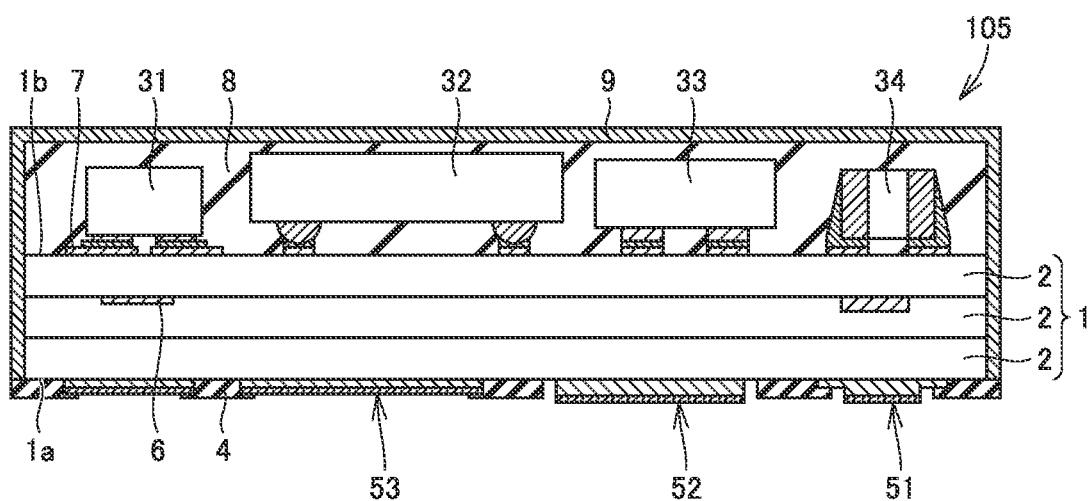
FIG. 21 is a cross-sectional view along the line XXI-XXI in FIG. 20.

An electronic component in a fifth embodiment based on the present disclosure will be described with reference to FIGS. 20 to 21. FIG. 20 shows a bottom view of an electronic component 105 in the present embodiment. FIG. 21 shows a cross-sectional view along the line XXI-XXI in FIG. 20. In electronic component 105, one of GND terminals 12 is in the SMD structure. One of IO terminals 13 is in the SMD structure. In electronic component 105, one in a rightmost row of IO terminals 13 in FIG. 20 is defined as first electrode 51, GND terminal 12 located on the left thereof is defined as second electrode 52, and GND terminal 12 further on the left thereof is defined as third electrode 53.

The electronic component is otherwise similar in construction to electronic component 101 shown in the first embodiment.

The present embodiment can also obtain an effect similar to that described in the first embodiment.

(Exemplary Mounting on Mother Board)

A structure in which electronic component 101 described in the first embodiment is mounted on a mother board 200 will be described with reference to FIG. 22. A plurality of electrodes 60 are arranged on a surface of mother board 200. In mounting, each electrode of electronic component 101 is soldered to each corresponding electrode 60 of mother board 200. In other words, solder 61 is interposed between first electrode 51 of electronic component 101 and electrode 60 corresponding thereto. Solder 61 is interposed also between second electrode 52 of electronic component 101 and electrode 60 corresponding thereto.

Figure 22:
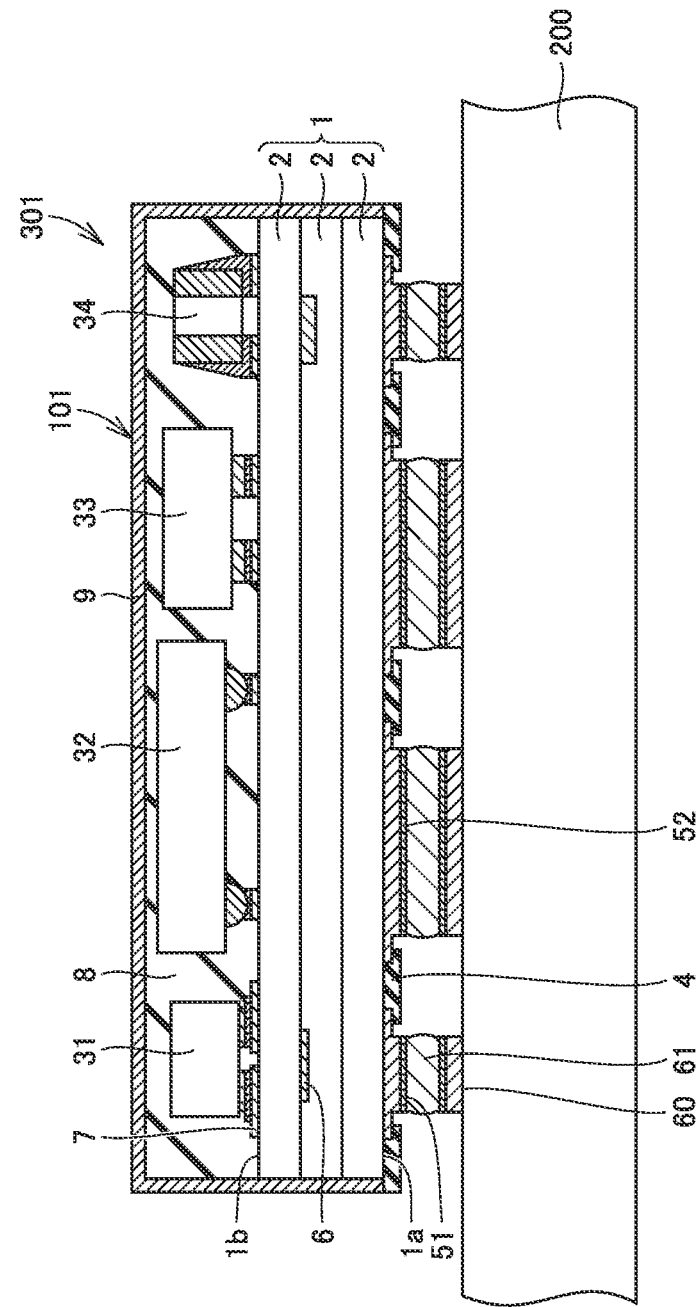
FIG. 22 is a cross-sectional view of the electronic component in the first embodiment based on the present disclosure mounted on a mother board.

The entirety shown in FIG. 22 can also be regarded as a single electronic component 301.

Though each embodiment shows some examples of arrangement of terminals on the lower surface of the electronic component, the shape, the number, and arrangement of the terminals as shown are merely by way of example. Such arrangement that the GND terminals are located in the center and the IO terminals are located in the outer edge portion is shown merely by way of example, and limitation as such is not intended. Four GND terminals are merely by way of example, and the number of GND terminals may be set to a number other than four. Sixteen IO terminals are merely by way of example, and the number of IO terminals may be set to a number other than sixteen.

Some features in the embodiments above may be adopted as being combined as appropriate.

The embodiments disclosed herein are illustrative and non-restrictive in every respect. The scope of the present disclosure is defined by the terms of the claims and is intended to include any modifications within the scope and meaning equivalent to the terms of the claims.

1 substrate; 1a first surface; 2 insulating layer; 4 resist film; 4a (semi-cured) resist film; 5 conductor pattern; 6 internal electrode; 7 surface electrode; 8 sealing resin; 9 shield film; 12 GND terminal; 13 IO terminal; 15 conductor film; 16 plated film; 31, 32, 33, 34 component; 51 first electrode; 52 second electrode; 53 third electrode; 60 electrode; 61 solder; 81 light; 101, 102, 103, 104, 105, 301 electronic component; 200 mother board; 511 first portion; 512 second portion

The invention claimed is:

1. An electronic component comprising: a main body including a first surface; a first electrode and a second electrode arranged on the first surface; and a resist film arranged to isolate the first electrode from the second electrode, wherein the first electrode and the second electrode are mainly composed of a first material, the first electrode includes a first portion including a central portion and having a first thickness and a second portion having a second thickness less than the first thickness in at least a part of a peripheral portion, and the first portion is covered with a plated film where a film comprising a second material higher in affinity for solder than the first material is exposed at an outermost surface, wherein the second material is Au, wherein the plated film includes a two-layered structure composed of a Ni plated film and an Au plated film, at least a part of the second portion is covered with the resist film, wherein the first portion and the plated film are distant from the resist film.

2. The electronic component according to claim 1, wherein a height difference is provided between the first portion and the second portion.

3. The electronic component according to claim 1, wherein the first material is Cu.

4. The electronic component according to claim 1, wherein a thickness of the first electrode gradually varies between the first portion and the second portion.

5. The electronic component according to claim 2, wherein the first material is Cu.

6. The electronic component according to claim 2, wherein the second material is Au.

7. The electronic component according to claim 3, wherein the second material is Au.

* * * * *